United States Patent
Kim et al.

(10) Patent No.: US 6,670,206 B2
(45) Date of Patent: Dec. 30, 2003

(54) METHOD FOR FABRICATING SURFACE ACOUSTIC WAVE FILTER PACKAGES

(75) Inventors: Tae Hoon Kim, Suwon (KR); Chan Wang Park, Seoul (KR); Joo Hun Park, Suwon (KR); Jae Myung Kim, Suwon (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 18 days.

(21) Appl. No.: 10/119,725

(22) Filed: Apr. 11, 2002

(65) Prior Publication Data

US 2003/0109077 A1 Jun. 12, 2003

(30) Foreign Application Priority Data

Dec. 7, 2001 (KR) ........................................ 2001-77278

(51) Int. Cl.[7] ........................ H01L 21/00; H01L 21/44; H01L 21/48; H01L 21/50

(52) U.S. Cl. ............................ 438/26; 438/22; 438/28; 438/33; 438/107; 438/108; 438/110; 438/112; 438/113; 438/115; 438/125; 438/127; 438/460; 438/458

(58) Field of Search .............................. 438/22, 26, 28, 438/33, 107, 108, 110, 112, 113, 115, 460, 125–127, 458

(56) References Cited

U.S. PATENT DOCUMENTS

| | | | | |
|---|---|---|---|---|
| 5,918,113 A | * | 6/1999 | Higashi et al. | 438/119 |
| 6,096,155 A | * | 8/2000 | Harden et al. | 156/250 |
| 6,242,283 B1 | * | 6/2001 | Lo et al. | 438/106 |
| 6,287,894 B1 | * | 9/2001 | Sawin | 438/113 |
| 6,310,403 B1 | * | 10/2001 | Zhang et al. | 257/786 |
| 6,376,278 B1 | * | 4/2002 | Egawa et al. | 438/110 |
| 6,492,194 B1 | * | 12/2002 | Bureau et al. | 438/106 |
| 6,514,789 B2 | * | 2/2003 | Denton et al. | 438/106 |
| 6,534,341 B2 | * | 3/2003 | Farnworth | 438/114 |
| 6,544,814 B1 | * | 4/2003 | Yasunaga et al. | 438/108 |

* cited by examiner

Primary Examiner—David A. Zarneke
(74) Attorney, Agent, or Firm—Lowe Hauptmann Gilman & Berner LLP

(57) ABSTRACT

Disclosed is a method for simply fabricating plural surface acoustic wave filter chip packages in large quantities comprising the steps of providing a wafer, on the surface of which plural surface acoustic wave filter chips are formed, and a package substrate, on the surface of which mounting portions corresponding to surface acoustic wave filter chips are formed; providing underfill on the package substrate; mounting the wafer on the package substrate; removing wafer portions between surface acoustic wave filter chips; forming metal shield layers on outer walls of separated surface acoustic wave filter chips; molding a resin on outer walls of surface acoustic wave filter chips coated with metal layers; and dividing the package substrate molded with resin into individual surface acoustic wave filter chip packages.

11 Claims, 3 Drawing Sheets

METHOD FOR FABRICATING SURFACE ACOUSTIC WAVE FILTER PACKAGES

BACKGROUND OF THE INVENTION

1. Field of the Invention

The present invention relates, in general, to a method for fabricating surface acoustic wave filter packages and, in particular, to a method for fabricating plural surface acoustic wave filter packages at the same time, in which a wafer having plural surface acoustic wave filter chips is mounted on the substrate having plural mounting portions corresponding to SAW filter chips and each SAW filter chip package is separated through two phases.

2. Description of the Prior Art

Surface acoustic wave filters (hereinafter referred to as "SAW filters") are frequently used in commercial and other applications as RF and IF filters to provide frequency selectivity and other electronic functions. Because the acoustic wave in the SAW filter often propagates along or very near the surface, the SAW filter is generally very sensitive to surface conditions.

On the whole, a protector is provided to the lower side of the SAW filter to form an air gap for protecting the surface of the SAW filter. Subsequently, on a substrate is mounted the protector-attached SAW filter chip along the outer side of which a metal shield layer is provided for excluding external electrical effects from the SAW filter. As a result, a SAW filter chip package is obtained.

As described above, processes for packaging the SAW filter chip sensitive to external effects are very complicated, unlike processes for packaging other devices, and each SAW filter chip package is individually fabricated in accordance with conventional packaging processes.

In order to better understand the background of the present invention, a description will be given of a conventional method for fabricating the surface acoustic wave filter chip package, below.

FIGS. 1a to 1f are schematic cross sectional views illustrating stepwise conventional fabrication of a SAW filter chip package.

With reference to FIG. 1a, a wafer (not shown) having plural SAW filter chips is divided into individual SAW filter chips 3, and a substrate 2 having plural mounting portions corresponding to SAW filter chips is provided. Protectors 5 are attached to a lower side of the SAW filter chip 3, and bumps 4 for flip chip bonding are attached to an upper side of the substrate 2.

Referring to FIG. 1b, each SAW filter chip 3 is mounted on each mounting portions of the substrate 2, and the SAW filter chip is electrically and mechanically connected to a wiring portion of the substrate 2 by flip chip bonding.

Turning now to FIG. 1c, underfills 6 are filled into a space between the substrate and the SAW filter chip. When underfills 6 are filled between the substrate and the SAW filter chip, an active region positioned on a lower side surface of the SAW filter chip is protected by the air gap formed by protectors 5.

Referring to FIG. 1d, fillets 7 are formed in order to improve step-coverages of sides of SAW filter chips. Fillets 7 are composed of an insulating material, and give a gentle slope to sides of the SAW filter chip 3 having the form of a stepped pyramid, so that the metal layer can be easily formed on the SAW filter chip.

With reference to FIG. 1e, after the fillet is formed, the metal shield layer 8 is formed on the outer wall of the SAW filter chip. To secure reliability of the SAW filter chip, an inner metal layer intercepting external electrical effects is formed on an upper side of the chip, and then an outer metal layer for preventing oxidation of the inner metal layer owing to exposure of the inner metal layer to the atmosphere is additionally formed on the inner metal layer.

After forming of the metal shield layer 8 is accomplished, the resulting SAW filter chip package is marked to allow its identification. That is to say, a dark color paste is coated on the metal shield layer 8 to form an identification layer 9, as shown in FIG. 1f.

As described above, according to a conventional method for fabricating SAW filter chip packages, SAW filter chips are packaged as individual chip units. That is to say, after plural chips on a wafer are divided into individual chips, each chip is mounted on a package substrate, a underfill material is provided to a space between each SAW filter chip and the package substrate, and the step of forming fillets or metal shield layers and a marking step are conducted for individual chip unit. Accordingly, a method for fabricating SAW filter chip packages is very complicated.

Furthermore, when underfill formed around lower sides of flanks of chips, which are adjacent to each other, is connected to adjacent underfill while underfill is formed, metal shield layers may not be coated on portions, in which underfill is connected to adjacent underfill, around lower sides of flanks of chips. Accordingly, underfill should be elaborately formed in the conventional method for fabricating SAW filter chip packages.

Consequently, the conventional method for fabricating SAW filter chip packages is conducted in individual chip units, and so individual steps as well as entire steps are complicated. In particular, as exemplified by the step of forming the metal shield layer to exclude an outside noise and increase reliability of the SAW filter package and the step of forming the fillet, the steps required for the conventional method for fabricating SAW filter chip packages are so complicated as to be not collectively conducted.

Therefore, there continues to be a need for an improved method for fabricating plural surface acoustic wave filter packages, which can guarantee reliability against external effects and be collectively conducted by the wafer unit.

SUMMARY OF THE INVENTION

Therefore, it is an object of the present invention to avoid disadvantages of prior arts, and to provide to a method for fabricating plural surface acoustic wave filter packages at the same time, in which a wafer having plural surface acoustic wave filter chips is mounted on the substrate having plural mounting portions corresponding to positions of SAW filter chips and each SAW filter chip package is separated through two phases.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1A:
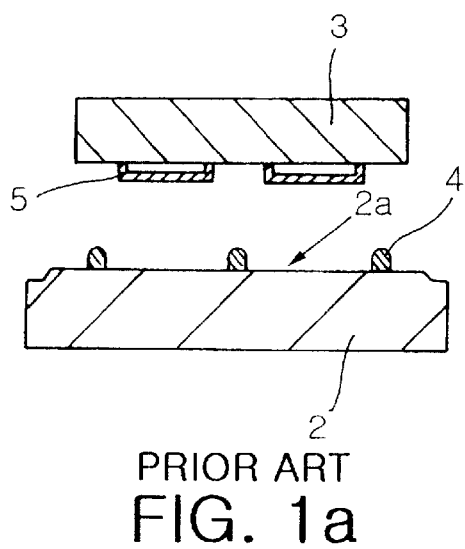
FIGS. 1a to 1f are schematic cross sectional views illustrating stepwise conventional fabrication of a SAW filter chip package.
Figure 1B:
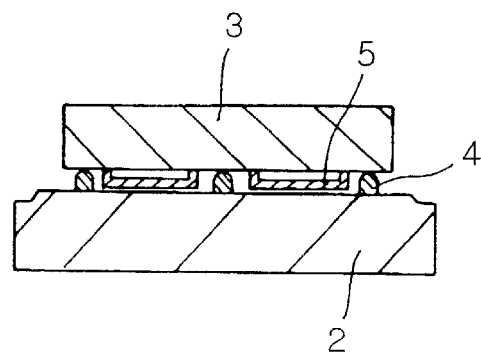
Figure 1C:
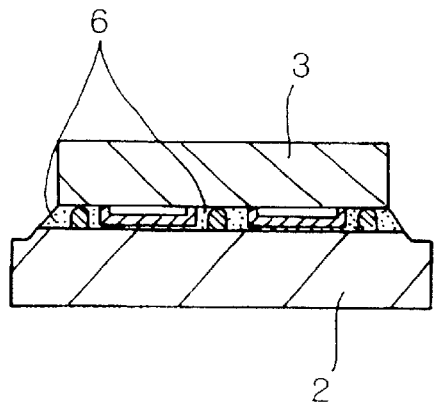
Figure 1D:
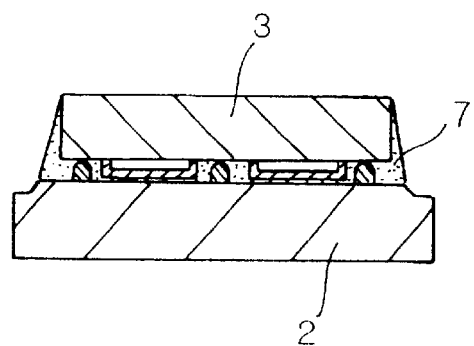
Figure 1E:
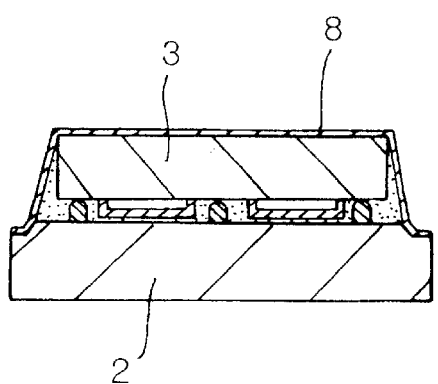
Figure 1F:
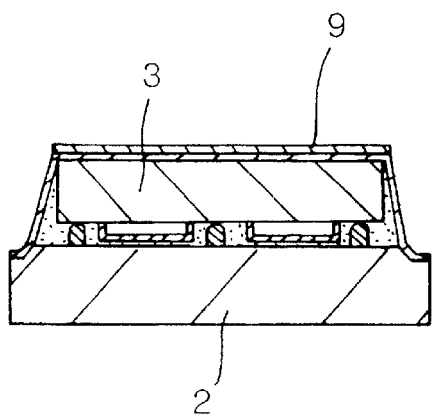

The present invention provides a method for fabricating plural surface acoustic wave filter chip packages comprising the steps of providing a wafer, on the surface of which plural surface acoustic wave filter chips are formed, and a package substrate, on the surface of which mounting portions corresponding to surface acoustic wave filter chips are formed; providing underfill to mounting portions on the package substrate; mounting the wafer on the package substrate so that surface acoustic wave filter chips are connected to mounting portions; removing wafer portions between surface acoustic wave filter chips to separate surface acoustic wave filter chips to each other; forming metal shield layers on outer walls of separated surface acoustic wave filter chips; molding a resin on outer walls of surface acoustic wave filter chips coated with metal layers; and dividing the package substrate molded with resin into individual surface acoustic wave filter chip packages.

According to an embodiment of the present invention, plural bumps are set on mounting portions of the package substrate so that SAW filter chips are electrically connected to a wiring portion of the package substrate and mechanically attached to the package substrate by a flip chip bonding.

Furthermore, according to the present invention, wafer portions between surface acoustic wave filter chips may be removed by etching wafer portions or by dicing the wafer with the use of a blade having a predetermined width. In case of using the blade, it is preferable to use a blade having the same width as a region between surface acoustic wave filter chips. In addition, the package substrate molded with resin is divided along boundaries between surface acoustic wave filter chip packages by use of the blade. The boundaries between surface acoustic wave filter chip packages are determined as middles of regions formed between surface acoustic wave filter chip packages. Also, it is preferable that the width of the blade used in dividing the package substrate molded with resin is narrower than that used in removing wafer portions between surface acoustic wave filter chips.

According to another embodiment of the present invention, a fillet composed of an insulating material may be additionally provided to lateral walls of SAW filter chips after wafer portions between SAW filter chips are removed. The fillet fills the role of improving a step-coverage in order to easily form metal shield layers as well as filling a portion, in which underfill is damaged, around a lower side of lateral walls of SAW filter chips when wafer portions between SAW filter chips are removed.

According to a preferred embodiment of the present invention, metal shield layers may be formed by coating conductive epoxy in a spray manner. The spray manner has advantages in that metal shield layers are formed on whole outer walls of SAW chips regardless of stepped sides of SAW chips.

Also, according to the present invention, resin is easily molded in a simple shape such as a rectangular parallelepiped on an upper side of the package substrate by EMC (epoxy molding compound) top molding. The simple shape provides structural stability to the SAW filter chip package. Resin may be selected from the group consisting of thermoplastic resin, thermosetting resin, and epoxy resin.

The present invention may be understood more readily by reference to the following detailed description of preferred embodiments of the invention and the figures.

FIGS. 2a to 2h are schematic cross sectional views illustrating stepwise fabrication of a SAW filter chip package according to the present invention.

Figure 2A:
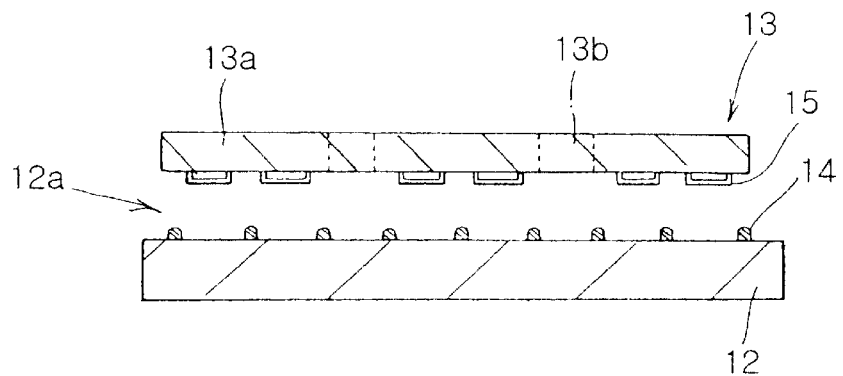
FIGS. 2a to 2h are schematic cross sectional views illustrating stepwise fabrication of a SAW filter chip package according to the present invention.
Figure 2B:
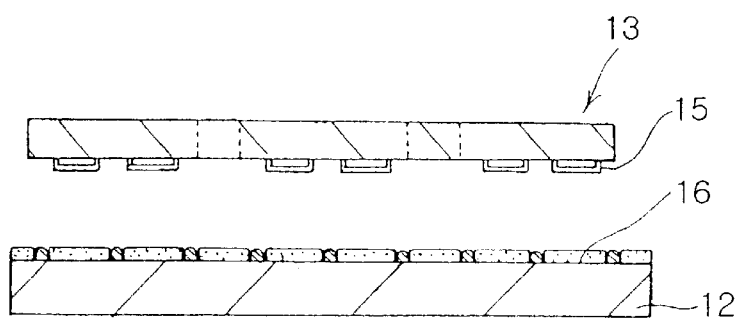

With reference to FIG. 2a, a wafer 13 having plural SAW filter chips 13a and a package substrate 12 having plural mounting portions 12b, which will be connected to SAW filter chips, are provided. Each position of SAW filter chips 13a on the wafer 13 corresponds to each position of mounting portions 12a on the package substrate 12.

Also, SAW filter chips 13a on the wafer 13 are provided with plural protectors 15, which are attached to each lower side of SAW filter chips, in order to form air gap regions for protecting the lower side surface of the chip, and bumps 14 are attached to the package substrate 12 so that mounting portions 12b are connected to SAW filter chips 13 by a flip chip bonding.

Figure 2C:
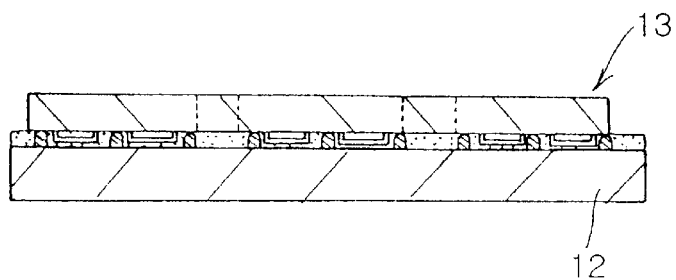

After that, underfill materials are provided to the upper side of the package substrate before the wafer 13 is mounted on the package substrate, contrary to the conventional method in which underfill materials are provided to the upper side of the package substrate after the SAW filter chip is mounted on the substrate. That is to say, underfill materials 16 are provided to the upper side of package substrate 12 (FIG. 2b), and the wafer 13 is mounted on the package substrate 12 so that each position of SAW filter chips on the wafer 12 are fitted into the corresponding mounting portions 12b (FIG. 2c). In detail, the SAW filter chip 13a is electrically connected and mechanically attached to a wiring portion of the package substrate 12 through the bump 14 on the mounting portion 12b.

Figure 2D:
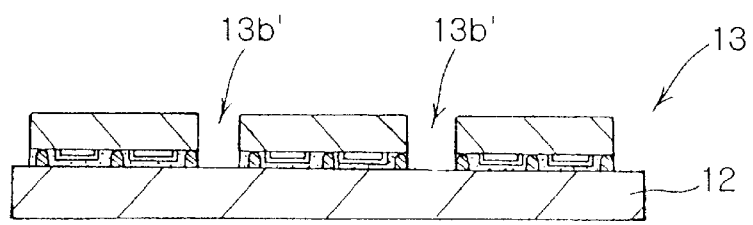

Turning now to FIG. 2d, wafer portions 13b between SAW filter chips 13a are removed, and thus the wafer 13 is divided into plural SAW filter chips 13a. The wafer 13 may be divided into plural chips through an etching process or a dicing process with the use of a blade. To sufficiently cover the SAW filter chip with the metal shield layer, underfill portions beneath the removed wafer portions should be also removed.

Figure 2E:
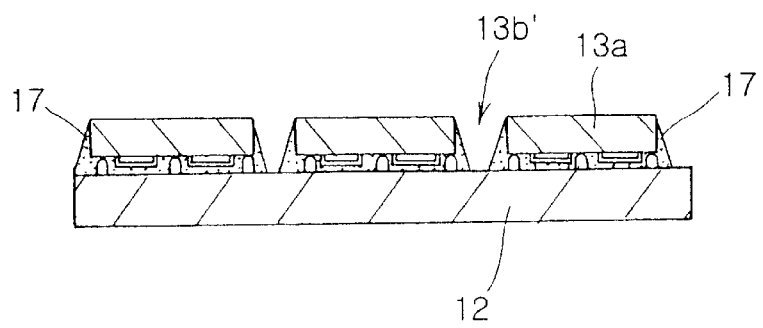

Reference to FIG. 2e, fillets 17 are selectively formed around flanks of SAW filter chips 13a. Composed of insulating materials, the fillets 7 relieve the step formed by the flank of the chip and the substrate. In result, the fillets 7 serve to improve the step coverage, thus facilitating the subsequent process, that is, the formation of the metal shield layer.

Figure 2F:
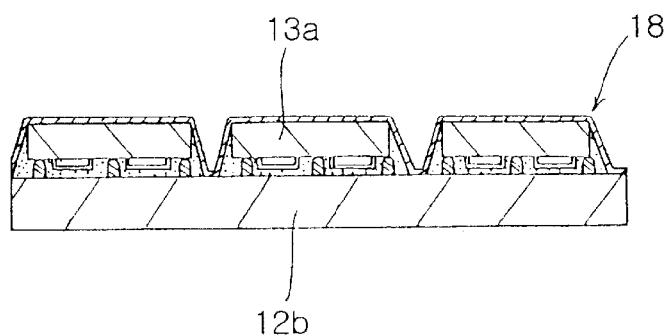

FIG. 2f is a diagram after a metal shield layer 18 is formed over the entire area of the chip structure 13a constructed on the substrate 12, that is, the area including the upper side of the SAW filter chips 13a and the walls of the fillets 7 around the flanks of the SAW filter chips 13a.

Serving to exclude external noises, the metal shield layer 18 is usually formed by plating. Another process may be used for the formation of the metal shield layer 18. For example, the metal shield layer may be formed by coating conductive epoxy with the use of a spray. In this case, the step of fillet formation illustrated in FIG. 2e may be omitted because the conductive epoxy is well spray-coated at the step between the chip and the substrate.

Figure 2G:
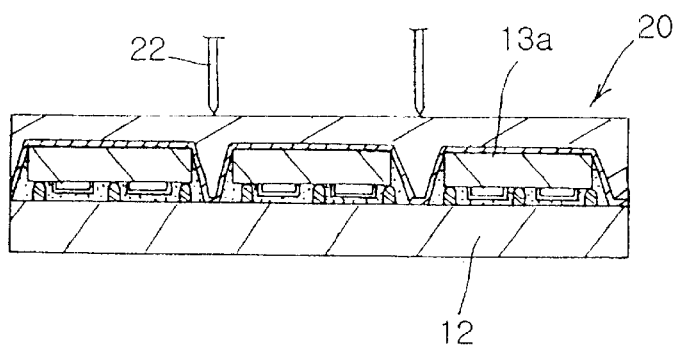

Referring to FIG. 2g, resin molding portions 20 are formed on SAW filter chips 13a and package substrates 12 with resin. In detail, resin materials are filled into depression portions 13b' formed between chips as well as into the upper side of the SAW filter chip 13a to form resin molding portions 20.

Thermoplastic resin, thermosetting resin, or epoxy resin may be used as resin materials, and a molding process with the use of epoxy and EMC (epoxy molding compound) top molding process may be selectively used to form resin molding portions. In case of using epoxy, a dam structure (not shown) may be preferably formed around a rim of the package substrate so that epoxy does not flow outside of the package substrate.

Figure 2H:
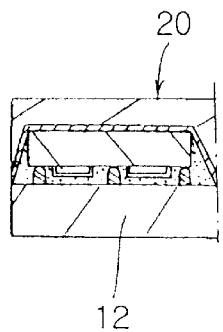

The resulting package substrate 12 is divided into individual SAW filter chip packages. At this time, a blade 22 with a narrow width is used because boundaries between SAW filter chip packages should be delicately cut, contrary to a step of wafer separation in FIG. 2d. It is preferable that the boundary between SAW filter chip packages is defined as a middle of a region between SAW filter chip packages. The middle of a region between SAW filter chip packages is vertically downwardly cut, thereby an individual SAW filter chip package can be obtained as shown in FIG. 2h.

As described above, the present invention provides a method for simply fabricating plural surface acoustic wave filter packages with an increased production yield, comprising the steps of providing a wafer, on the surface of which plural surface acoustic wave filter chips are formed, and a package substrate, on the surface of which mounting portions corresponding to surface acoustic wave filter chips are formed; providing underfill to mounting portions on the package substrate; mounting the wafer on the package substrate so that surface acoustic wave filter chips are connected to mounting portions; removing wafer portions between surface acoustic wave filter chips to separate surface acoustic wave filter chips from each other; forming metal shield layers on outer walls of separated surface acoustic wave filter chips; molding resin on outer walls of surface acoustic wave filter chips coated with metal layers; and dividing the resulting package substrate into individual surface acoustic wave filter chip packages.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method for fabricating plural surface acoustic wave filter chip packages, comprising the steps of:

providing a wafer and a package substrate, said wafer having plural surface acoustic wave filter chips formed thereon, said package substrate being provided with mounting portions at positions corresponding to the positions of surface acoustic wave filter chips on the wafer;

forming underfill on the mounting portions of the package substrate;

mounting the wafer on the package substrate in such a way as to connect the surface acoustic wave filter chips to the mounting portions;

removing wafer portions between surface acoustic wave filter chips to separate the surface acoustic wave filter chips from each other;

overlaying a metal shield layer on outer sides of the separated surface acoustic wave filter chips;

molding a blanket of resin over the metal shield layer covering the surface acoustic wave filter chips; and dividing the package substrate molded with resin into individual surface acoustic wave filter chip packages.

2. The method according to claim 1, wherein the mounting portions of the package substrate are respectively provided with bumps for electrically and mechanically connecting surface acoustic wave filter chips to the package substrate.

3. The method according to claim 1, wherein said removing step is carried out by use of an etching process.

4. The method according to claim 1, wherein said removing step is carried out by dicing the wafer with the use of a blade having the substantially same width as the region between surface acoustic wave filter chips so as to separate surface acoustic wave filter chips from each other.

5. The method according to claim 1, wherein the dividing step is carried out by using a blade along with boundaries between the surface acoustic wave filter chip packages.

6. The method according to claim 5, wherein said boundaries between the surface acoustic wave filter chip packages are determined as middles of regions between the surface acoustic wave filter chip packages.

7. The method according to claim 5, wherein the width of the blade used in dividing the package substrate molded with resin is narrower than that used in removing wafer portions between the surface acoustic wave filter chips.

8. The method according to claim 1, wherein the metal shield layer is formed by spraying conductive epoxy over the outer sides of separated surface acoustic wave filter chips.

9. The method according to claim 1, wherein the molding step is carried out by an epoxy molding compound (EMC) top molding process.

10. The method according to claim 1, wherein said resin is any one selected from the group consisting of thermoplastic resin, thermosetting resin, and epoxy resin.

11. The method according to claim 1, wherein the package substrate has a dam structure formed around a rim of the package substrate.

* * * * *